United States Patent
Duan et al.

(10) Patent No.: US 10,201,097 B2
(45) Date of Patent: Feb. 5, 2019

(54) POLYMERS CONTAINING BENZIMIDAZOLE MOIETIES AS LEVELERS

(71) Applicants: ROHM AND HAAS ELECTRONIC MATERIALS LLC, Marlborough, MA (US); DOW GLOBAL TECHNOLOGIES LLC, Midland, MI (US)

(72) Inventors: Lingli Duan, Shanghai (CN); Yang Li, Shanghai (CN); Tong Sun, Shanghai (CN); Shaoguang Feng, Shanghai (CN); Chen Chen, Shanghai (CN); Zuhra Niazimbetova, Westborough, MA (US); Maria Rzeznik, Shrewsbury, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 252 days.

(21) Appl. No.: 15/023,562

(22) PCT Filed: Nov. 20, 2013

(86) PCT No.: PCT/CN2013/087477
§ 371 (c)(1),
(2) Date: Mar. 21, 2016

(87) PCT Pub. No.: WO2015/074190
PCT Pub. Date: May 28, 2015

(65) Prior Publication Data
US 2016/0255729 A1    Sep. 1, 2016

(51) Int. Cl.
| | | |
|---|---|---|
| C25D 3/38 | (2006.01) |
| H05K 3/42 | (2006.01) |
| C25D 3/02 | (2006.01) |
| C25D 3/32 | (2006.01) |
| H05K 3/24 | (2006.01) |
| C08G 73/06 | (2006.01) |
| C25D 5/56 | (2006.01) |
| C25D 7/00 | (2006.01) |
| C25D 7/12 | (2006.01) |

(52) U.S. Cl.
CPC ......... *H05K 3/423* (2013.01); *C08G 73/0677* (2013.01); *C25D 3/02* (2013.01); *C25D 3/32* (2013.01); *C25D 3/38* (2013.01); *C25D 5/56* (2013.01); *C25D 7/00* (2013.01); *C25D 7/123* (2013.01); *H05K 3/241* (2013.01)

(58) Field of Classification Search
None
See application file for complete search history.

(56) References Cited

U.S. PATENT DOCUMENTS

| | | |
|---|---|---|
| 5,147,750 A | 9/1992 | Nakanishi |
| 6,416,770 B1 | 7/2002 | Leduc et al. |
| 6,610,192 B1 | 8/2003 | Step et al. |
| 6,800,188 B2 | 10/2004 | Hagiwara |
| 7,128,822 B2 | 10/2006 | Wang et al. |
| 7,374,652 B2 | 5/2008 | Hayashi et al. |
| 8,262,895 B2 | 9/2012 | Niazimbetova et al. |
| 2006/0243599 A1 | 11/2006 | Shih et al. |
| 2010/0093975 A1 | 4/2010 | Chan et al. |
| 2011/0220513 A1* | 9/2011 | Niazimbetova ...... C07D 235/08 205/297 |

FOREIGN PATENT DOCUMENTS

| | | |
|---|---|---|
| CN | 102522204 | 8/2013 |
| JP | 05165258 A | 7/1993 |

OTHER PUBLICATIONS

Search report for corresponding Europe Application No. 13 89 7823 dated May 22, 2017.
Search report for corresponding China Application No. 201380080778.1 dated Jun. 26, 2018.

* cited by examiner

*Primary Examiner* — Stefanie S Wittenberg
(74) *Attorney, Agent, or Firm* — John J. Piskorski

(57) ABSTRACT

Polymers of reaction products of dihalogens and compounds containing benzimidazole moieties are included in metal electroplating compositions to provide level metal deposits on substrates.

3 Claims, No Drawings

POLYMERS CONTAINING BENZIMIDAZOLE MOIETIES AS LEVELERS

FIELD OF THE INVENTION

The present invention is directed to polymers containing benzimidazole moieties as levelers for electroplating compositions. More specifically, the present invention is directed to polymers containing benzimidazole moieties as levelers for electroplating compositions which good thermal reliability and throwing power.

BACKGROUND OF THE INVENTION

Methods for electroplating articles with metal coatings generally involve passing a current between two electrodes in a plating solution where one of the electrodes is the article to be plated. A typical acid copper plating solution comprises dissolved copper, usually copper sulfate, an acid electrolyte such as sulfuric acid in an amount sufficient to impart conductivity to the bath, and proprietary additives to improve the uniformity of the plating and the quality of the metal deposit. Such additives include accelerators, levelers, and suppressors, among others.

Electrolytic copper plating solutions are used in a variety of industrial applications, such as decorative and anticorrosion coatings, as well as in the electronics industry, particularly for the fabrication of printed circuit boards and semiconductors. For circuit board fabrication, copper is electroplated over selected portions of the surface of a printed circuit board, into blind vias and onto the walls of through-holes passing between the surfaces of the circuit board base material. The walls of the through-holes are first made conductive, such as by electroless metal deposition, before copper is electroplated onto the walls of the through-holes. Plated through-holes provide a conductive pathway from one board surface to the other. For semiconductor fabrication, copper is electroplated over a surface of a wafer containing a variety of features such as vias, trenches or combinations thereof. The vias and trenches are metallized to provide conductivity between various layers of the semiconductor device.

It is well known in certain areas of plating, such as in electroplating of printed circuit boards ("PCBs"), that the use of accelerators and levelers in the electroplating bath can be crucial in achieving a uniform metal deposit on a substrate surface. Plating a substrate having irregular topography can pose particular difficulties. During electroplating a voltage drop variation typically exists along an irregular surface which can result in an uneven metal deposit. Plating irregularities are exacerbated where the voltage drop variation is relatively extreme, that is, where the surface irregularity is substantial. As a result, a thicker metal deposit, termed overplating, is observed over such surface irregularities. Consequently, a metal layer of substantially uniform thickness is frequently a challenging step in the manufacture of electronic devices. Leveling agents are often used in copper plating baths to provide substantially uniform, or level, copper layers in electronic devices.

The trend of portability combined with increased functionality of electronic devices has driven the miniaturization of PCBs. Conventional multilayer PCBs with through-hole interconnect vias are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit across the substrate surface. This is particularly challenging when the PCB contains both through-holes and blind vias.

Generally, leveling agents used in copper plating baths provide better leveling of the deposit across the substrate surface but tend to compromise the throwing power of the electroplating bath. Throwing power is defined as the ratio of the hole center copper deposit thickness to its thickness at the surface. Newer PCBs are being manufactured that contain both through-holes and blind vias. Current bath additives, in particular current leveling agents, do not provide level copper deposits on the substrate surface and fill through-holes and blind vias effectively. Accordingly, there remains a need in the art for leveling agents for use in copper electroplating baths in the manufacture of PCBs that provide level copper deposits while not significantly affecting the throwing power of the bath.

SUMMARY OF THE INVENTION

Polymers include a reaction product of one or more dihalogens with one or more compounds having formula:

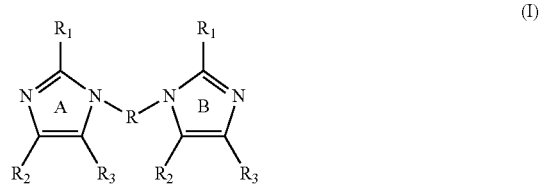

(I)

where $R_1$, $R_2$ and $R_3$ of rings A and B may be the same or different and are hydrogen, thiol, linear or branched thio($C_1$-$C_{12}$)alkyl, hydroxyl, linear or branched hydroxy($C_1$-$C_{12}$)alkyl, amine, linear or branched alkyl($C_1$-$C_{12}$)amine, linear or branched ($C_2$-$C_{12}$)alkyl, alkoxy, linear or branched alkoxy($C_1$-$C_{12}$)alkyl or substituted or unsubstituted aryl, with the proviso that at least one of the compounds of formula (I) which reacts with the one or more dihalogens to form the reaction product, $R_2$ and $R_3$ of ring A or B are taken together with their carbon atoms to form a fused substituted or unsubstituted six membered aromatic ring; and R is ($C_1$-$C_{12}$)alkyl, an ether moiety, polyether moiety, carbonyl, >C=S, >C=NH, substituted or unsubstituted aryl or substituted or unsubstituted cycloalkyl.

Metal electroplating compositions include: one or more sources of metal ions, an electrolyte, and one or more polymers, the one or more polymers include a reaction product of one or more dihalogens and one or more compounds having formula:

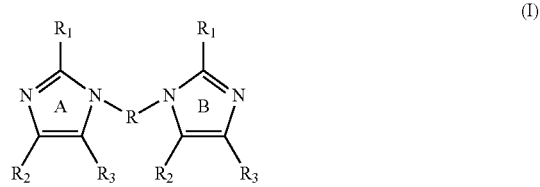

(I)

where $R_1$, $R_2$ and $R_3$ of rings A and B may be the same or different and are hydrogen, thiol, linear or branched thio($C_1$-$C_{12}$)alkyl, hydroxyl, linear or branched hydroxy($C_1$-$C_{12}$)alkyl, amine, linear or branched alkyl($C_1$-$C_{12}$)amine, linear or branched ($C_1$-$C_{12}$)alkyl, alkoxy, linear or branched alkoxy($C_1$-$C_{12}$)alkyl or substituted or unsubstituted aryl, with the proviso that at least one of the compounds of formula (I) which reacts with the one or more dihalogens to form the reaction product, $R_2$ and $R_3$ of ring A or B are taken together with their carbon atoms to form a fused substituted or unsubstituted six membered aromatic ring; and R is ($C_1$-$C_{12}$)alkyl, an ether moiety, polyether moiety, carbonyl, >C=S, >C=NH, substituted or unsubstituted aryl or substituted or unsubstituted cycloalkyl.

Methods include contacting a substrate to be metal plated with a metal electroplating composition including: a source of metal ions, an electrolyte, and one or more polymers, the one or more polymers include a reaction product of one or more dihalogens and one or more compounds having formula:

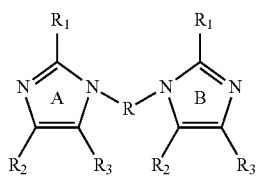

(I)

where $R_1$, $R_2$ and $R_3$ of rings A and B may be the same or different and are hydrogen, thiol, linear or branched thio ($C_1$-$C_{12}$)alkyl, hydroxyl, linear or branched hydroxy($C_1$-$C_{12}$)alkyl, amine, linear or branched alkyl($C_1$-$C_{12}$)amine, linear or branched ($C_1$-$C_{12}$)alkyl, alkoxy, linear or branched alkoxy($C_1$-$C_{12}$)alkyl or substituted or unsubstituted aryl, with the proviso that at least one of the compounds of formula (I) which reacts with the one or more dihalogens to form the reaction product, $R_2$ and $R_3$ of ring A or B are taken together with their carbon atoms to form a fused substituted or unsubstituted six membered aromatic ring; and R is ($C_1$-$C_{12}$)alkyl, an ether moiety, polyether moiety, carbonyl, >C=S, >C=NH, substituted or unsubstituted aryl or substituted or unsubstituted cycloalkyl; and plating the metal on the substrate.

The polymers provide metal layers having a substantially level surface across a substrate, even on substrates having small features and on substrates having a variety of feature sizes. The metal layers deposited according to the methods have improved thermal stability as compared to metal deposits from electroplating baths using conventional leveling agents. Further, the methods effectively deposit metals in through-holes and blind via holes such that the metal plating compositions have good throwing power.

DETAILED DESCRIPTION OF THE INVENTION

As used throughout this specification the following abbreviations shall have the following meanings unless the context clearly indicates otherwise: A=amperes; A/dm²=amperes per square decimeter=ASD; ° C.=degrees Centigrade; g=gram; mg=milligram; ppm=parts per million; mmol=millimoles; L=liter; L/m=liters per minute; μm=micron=micrometer; mm=millimeters; cm=centimeters; DI=deionized; mL=milliliter; Mw=weight average molecular weight; and Mn=number average molecular weight; and v/v=volume to volume. All amounts are percent by weight unless otherwise noted. All numerical ranges are inclusive and combinable in any order, except where it is clear that such numerical ranges are constrained to add up to 100%.

As used throughout the specification, "feature" refers to the geometries on a substrate. "Apertures" refer to recessed features including through-holes and blind vias. As used throughout this specification, the term "plating" refers to metal electroplating. The term "moiety" means a part of a molecule or polymer that may include either whole functional groups or parts of functional groups as substructures. "Deposition" and "plating" are used interchangeably throughout this specification. "Halide" refers to fluoride, chloride, bromide and iodide. "Accelerator" refers to an organic additive that increases the plating rate of the electroplating bath. A "suppressor" refers to an organic additive that suppresses the plating rate of a metal during electroplating. "Leveler" refers to an organic compound that is capable of providing a substantially level or planar metal layer. The terms "leveler" and "leveling agent" are used interchangeably throughout this specification. The terms "printed circuit boards" and "printed wiring boards" are used interchangeably throughout this specification. The articles "a" and "an" refer to the singular and the plural.

The polymers are reaction products of one or more dihalogens and one or more compounds having formula:

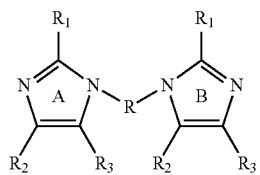

(I)

where $R_1$, $R_2$ and $R_3$ of rings A and B may be the same or different and may be hydrogen, thiol, linear or branched thio($C_1$-$C_{12}$)alkyl, hydroxyl, linear or branched hydroxy($C_1$-$C_{12}$)alkyl, amine, such as a primary, secondary or tertiary amine, linear or branched alkyl($C_1$-$C_{12}$)amine, linear or branched ($C_1$-$C_{12}$)alkyl, alkoxy, linear or branched alkoxy ($C_1$-$C_{12}$)alkyl or substituted or unsubstituted aryl, with the proviso that at least one of the compounds of formula (I) which reacts with the one or more dihalogens to form the reaction product, $R_2$ and $R_3$ of ring A or B are taken together with their carbon atoms to form a fused substituted or unsubstituted six membered aromatic ring, preferably, $R_2$ and $R_3$ of ring A and $R_2$ and $R_3$ of ring B are fused substituted or unsubstituted six membered rings; and R is a moiety having formula:

(II)

where r is an integer of 1 to 10, an ether moiety, polyether moiety, carbonyl, >C=S, >C=NH, substituted or unsubstituted aryl or substituted or unsubstituted cycloalkyl. Preferably $R_1$, $R_2$ and $R_3$ are the same or different and are hydrogen, hydroxyl, linear of branched hydroxy($C_1$-$C_5$) alky, primary amine, linear or branched ($C_1$-$C_5$)alkyl or alkoxy, more preferably, $R_1$, $R_2$ and $R_3$ are the same or different and are hydrogen, hydroxyl, hydroxy($C_1$-$C_3$)alkyl or ($C_1$-$C_3$)alkyl, most preferably $R_1$, $R_2$ and $R_3$ are the same or different and are hydrogen, hydroxyl or ($C_1$-$C_2$)alkyl. Preferably R is the moiety:

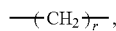
(II)

an ether moiety or a polyether moiety, more preferably R is the moiety of formula (II) and a polyether moiety, most preferably R is the moiety of formula (II) and r is an integer of preferably from 1 to 6, more preferably r is an integer of 1 to 4.

Ether moieties include, but are not limited to:

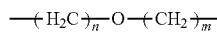
(III)

and polyether moieties include, but are not limited to:

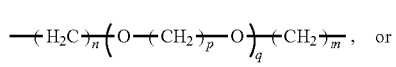
(IV)

or

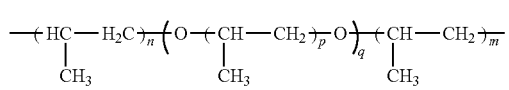
(V)

where n and m may be the same or different and are integers of 1 to 12, p is an integer of 2 to 12 and q is an integer of from 1 to 12. Preferably, n and m are the same or different and are 1 to 10, more preferably 1 to 5. Preferably, p is an integer of 2 to 10, more preferably an integer of 2 to 4, and q is preferably an integer of 1 to 10, more preferably an integer of 1 to 4.

Aryl moieties include, but are not limited to:

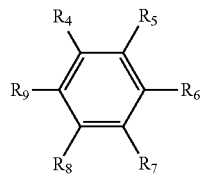
(VI)

where $R_4$, $R_5$, $R_6$, $R_7$, $R_8$ and $R_9$ are the same of different and include, but are not limited to: hydrogen, linear or branched $(C_1-C_{12})$alkyl, hydroxyl, carboxyl, thio, alkoxy, primary, secondary or tertiary amine, aldehyde, ketone or the moiety:

(II)

where r is as defined above with the proviso that two of $R_4$, $R_5$, $R_6$, $R_7$, $R_8$ and $R_9$ are the moiety (II) at the same instance to join the aryl moiety (VI) to the nitrogen of rings A and B of formula (I) above by covalent bonds, the two moieties are para or meta to each other. Preferably, $R_4$, $R_5$, $R_6$, $R_7$, $R_8$ and $R_9$ are the same or different and are hydrogen, linear or branched $(C_1-C_5)$alkyl, hydroxyl, primary amine or the moiety of formula (II) with the proviso that two of $R_4$, $R_5$, $R_6$, $R_7$, $R_8$ and $R_9$ are the moiety (II) at the same instance and the two moieties are para or meta to each other, more preferably, $R_4$, $R_5$, $R_6$, $R_7$, $R_8$ and $R_9$ are the same or different and are hydrogen, hydroxyl or the moiety of formula (II) where r is defined above with the proviso that two of $R_4$, $R_5$, $R_6$, $R_7$, $R_8$ and $R_9$ are the moiety (II) at the same instance and the two moieties are para or meta to each other, preferably r is an integer of 1 to 6, more preferably, it is an integer of 1 to 4.

Cycloalkyl moieties include, but are not limited to:

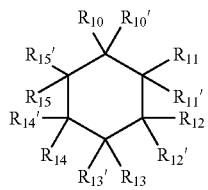
(VII)

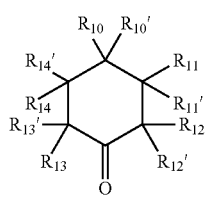
(VIII)

where $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ may be the same or different and include, but are not limited to: hydrogen, linear or branched $(C_1-C_{12})$alkyl, hydroxyl, carboxyl, thio, alkoxy, primary, secondary or tertiary amine, aldehyde, ketone or the moiety:

(II)

where r is as defined above with the proviso that two of $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ are the moiety (II) at the same instance to join the aryl moiety (VI) to the nitrogen of rings A and B of formula (I) above by covalent bonds, the two moieties are on different carbons and are para or meta to each other. Preferably, $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ are the same or different and are hydrogen, linear or branched $(C_1-C_5)$alkyl, hydroxyl, primary amine or the moiety of formula (II) with the proviso that two of $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ are the moiety (II) at the same instance, the two moieties are on different carbons and are para or meta to each other, more preferably, $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ are the same or different and are hydrogen, linear or branched $(C_1-C_4)$alkyl, hydroxyl or the moiety of formula (II) with the proviso that two of $R_{10}$, $R_{10}'$, $R_{11}$, $R_{11}'$, $R_{12}$, $R_{12}'$, $R_{13}$, $R_{13}'$, $R_{14}$, $R_{14}'$, $R_{15}$ and $R_{15}'$ are the moiety (II) at the same instance, the two moieties are on different carbons and are para or meta to each other, preferably r is an integer of 1 to 6, more preferably from 1 to 4.

Methods of preparing the compounds of formula (I) are not limited; however, they are typically prepared by reacting a substituted or unsubstituted benzimidazole which includes a five-membered nitrogen containing heterocyclic ring fused to a six membered ring with a dihalogen compound. Such benzimidazoles include, but are not limited to:

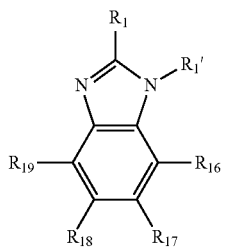
(IX)

where $R_1$ is defined above and $R_1'$ is hydrogen, $R_{16}$, $R_{17}$, $R_{18}$ and $R_{19}$ include, but are not limited to hydrogen, hydroxyl, amino; amide; linear or branched hydroxy($C_1$-$C_{10}$)alkyl, linear or branched ($C_1$-$C_{10}$)alkoxy, halide, linear or branched halo($C_1$-$C_{10}$)alkyl, —$NH_2$, primary, secondary or tertiary linear or branched ($C_1$-$C_{12}$)alkylamine, aldehyde, ketone, carboxyl, linear or branched carboxy($C_1$-$C_{10}$)alkyl, linear or branched ($C_1$-$C_{20}$)alkyl; or substituted or unsubstituted aryl. Preferably, $R_{16}$, $R_{17}$, $R_{18}$ and $R_{19}$ are hydrogen, hydroxyl, —$NH_2$, primary or secondary linear or branched ($C_1$-$C_5$)alkylamine, carboxyl, linear or branched carboxy ($C_1$-$C_5$)alkyl or linear or branched ($C_1$-$C_5$)alkyl, more preferably, $R_{16}$, $R_{17}$, $R_{18}$ and $R_{19}$ are hydrogen, hydroxyl, —$NH_2$, carboxyl or ($C_1$-$C_3$)alkyl. Most preferably $R_{16}$, $R_{17}$, $R_{18}$ and $R_{19}$ are hydrogen or hydroxyl. Dihalogens include, but are not limited to compounds having a formula:

X—R—X (X)

where R is defined above and X is a halogen chosen from chlorine, bromine, fluorine and iodine. Preferably the halogen is chlorine, bromine and fluorine, more preferably, the halogen is chlorine and bromine, most preferably, the halogen is bromine.

The reaction product of the benzimidazoles of formula (IX) and the dihalogens of formula (X) have the following dibenzimidazole general formula:

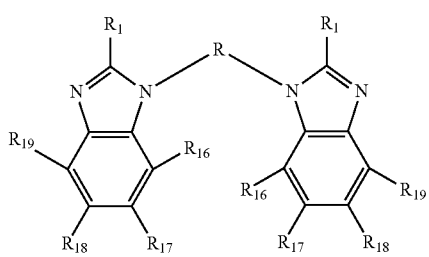
(XI)

where R, $R_1$, $R_{16}$, $R_{17}$, $R_{18}$ and $R_{19}$ are as defined above.

Imidazoles include, but are not limited to, those having a formula:

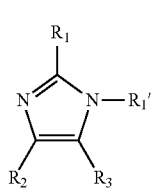
(XII)

where $R_1$, $R_1'$, $R_2$ and $R_3$ are as defined above. The imidazole compounds are then reacted with the dihalogens of formula (X) above to form dimidazoles having the formula:

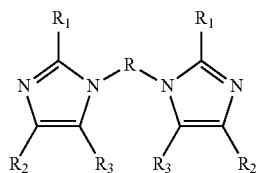
(XIII)

where R, $R_1$, $R_2$ and $R_3$ are as defined above.

Alternatively, the benzimidazoles of formula (IX) and the imidazoles of formula (XII) may be reacted together with the dihalogens of formula (X) to form compounds having the benzimidazole and imidazole moieties of the following formula:

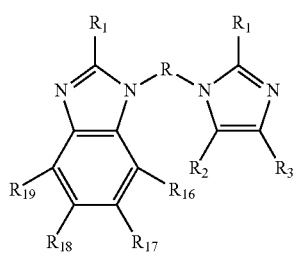
(XIV)

where R, $R_1$, $R_2$, $R_3$, $R_{16}$, $R_{17}$, $R_{18}$ and $R_{19}$ are as defined above.

The reaction conditions and parameters to form the compounds described above may vary depending on the desired quantities of the compounds. The amounts of reagents used may be readily determined by those of skill in the art with minor experimentation and using synthesis methods disclosed in the chemical literature. Typically, the molar ratio of benzimidazole or imidazole to dihalogen ranges from 1:1 to 2:1. In general, the benzimidzole, imidazole or combinations thereof are mixed with a strong base such as a saline hydride, typically sodium hydride. The mixture is dissolved in an organic solvent such as polar ethers, typically tetrahydrofuran, or other conventional organic solvents, such as dimethylformamide. Mixing is done for a sufficient amount of time while cooling until generation of hydrogen gas ceases. One or more dihalogens are then added to the mixture and mixing of the reactants is done at room temperature until a precipitate of the product is formed. Typically mixing is done from 10 hours to 15 hours. The solvent may be removed from the precipitate by evaporation.

The compounds containing the benzimidazole and imidazole moieties described above in formulae (I), (XI), (XIII) and (XIV) are then reacted with one or more dihalogens having the general formula below to form the polymer.

X—R'—X (XV)

where X is as defined above and R' includes the same moieties as R defined above and further includes, but is not limited to, the following moieties:

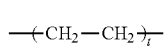
(XVI)

where t is an integer from 1 to 10, preferably from 1 to 5, more preferably from 1 to 3; and

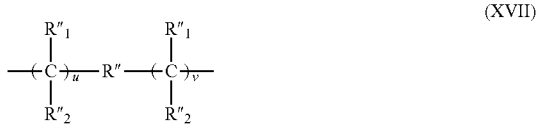

(XVII)

where $R''_1$ and $R''_2$ are the same or different and include, but are not limited to, hydrogen, linear or branched ($C_1$-$C_4$)alkyl or hydroxyl, preferably hydrogen or ($C_1$-$C_2$)alkyl, more preferably hydrogen or methyl and u and v are the same or different and are integers of 1 to 10, preferably from 1 to 5, more preferably from 1 to 3 and R'' is a cycloalky, preferably a cyclohexyl alky, or an aryl, preferably, phenyl.

The reaction conditions and parameters to form the benzimidazole moiety containing polymer may vary depending on the desired quantities of the polymer. The amounts of reagents used may be readily determined by those of skill in the art with minor experimentation and using synthesis methods disclosed in the chemical literature. Typically, the molar ratio of dibenzimidazole or diimidazole to dihalogen ranges from 1:0.1 to 1:5, preferably from 1:0.1 to 1:3, more preferably from 1:0.1 to 1:2. In general, the dibenzimidzole, diimidazole or combinations thereof and one or more dihalogens are mixed in an organic solvent such as polar ethers, typically tetrahydrofuran, or other conventional organic solvents, such as dimethylformamide. Mixing is done for 12 hours to 30 hours at temperatures of 70° C. to 120° C., preferably from 90° C. to 110° C. The polymer product is then washed with organic solvent.

Exemplary polymers may have the following general formulae:

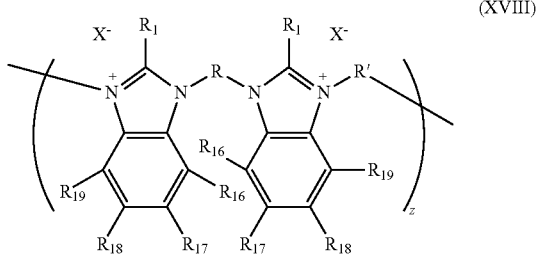

(XVIII)

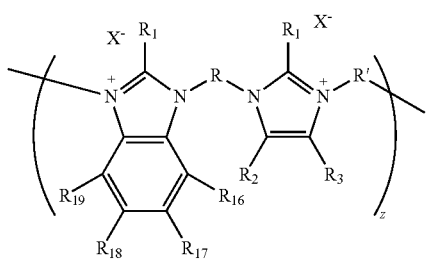

(XIX)

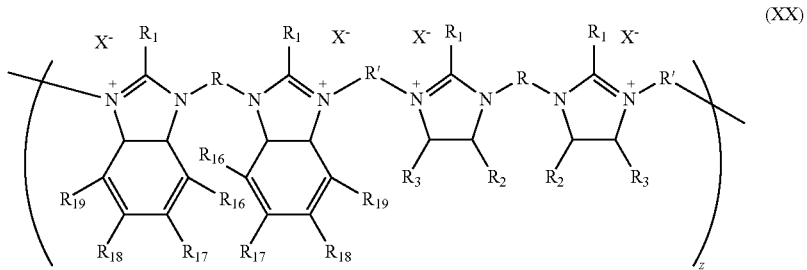

(XX)

where R, R', $R_1$, $R_2$, $R_3$, $R_{16}$, $R_{17}$, $R_{18}$, $R_{19}$ and X are defined as above and z is an integer of 2 or greater, preferably from 5 to 20, more preferably from 5 to 10.

The plating composition and method are useful in providing a substantially level plated metal layer on a substrate, such as a printed circuit board. Also, the plating composition and method are useful in filling apertures in a substrate with metal. The metal deposits are substantially crack-free and have good throwing power.

Substrates which may be electroplated with metal plating baths containing the reaction products described above include, but are not limited to: printed wiring boards, integrated circuits, semiconductor packages, lead frames and interconnects. An integrated circuit substrate may be a wafer used in a dual damascene manufacturing process. Such substrates typically contain a number of features, particularly apertures, having a variety of sizes. Through-holes in a PCB may have a variety of diameters, such as from 50 μm to 350 μm in diameter. Such through-holes may vary in depth, such as from 35 μm to 100 μm. PCBs may contain blind vias having a wide variety of sizes, such as up to 200 μm, or greater.

Conventional metal plating compositions may be used. The metal plating compositions contain a source of metal ions, an electrolyte, and a leveling agent, where the leveling agent is a reaction product of one or more compounds of formula (I) with one or more dihalogens. The metal plating compositions may contain a source of halide ions, an accelerator and a suppressor. Metals which may be electroplated from the compositions include, but are not limited to, copper, tin and tin/copper alloys.

Suitable copper ion sources are copper salts and include without limitation: copper sulfate; copper halides such as copper chloride; copper acetate; copper nitrate; copper fluoroborate; copper alkylsulfonates; copper arylsulfonates; copper sulfamate; and copper gluconate. Exemplary copper alkylsulfonates include copper ($C_1$-$C_6$)alkylsulfonate and more preferably copper ($C_1$-$C_3$)alkylsulfonate. Preferred copper alkylsulfonates are copper methanesulfonate, copper ethanesulfonate and copper propanesulfonate. Exemplary copper arylsulfonates include, without limitation, copper phenyl sulfonate, copper phenol sulfonate and copper p-toluene sulfonate. Mixtures of copper ion sources may be used. It may be appreciated by those skilled in the art that one or more salts of metal ions other than copper ions may be advantageously added to the present electroplating baths. Typically, the copper salt is present in an amount sufficient to provide an amount of copper metal of 10 to 180 g/L of plating solution.

Suitable tin compounds include, but are not limited to: salts, such as tin halides, tin sulfates, tin alkane sulfonate such as tin methane sulfonate, tin aryl sulfonate such as tin phenyl sulfonate, tin phenol sulfonate and tin toluene sulfonate, tin alkanol sulfonate. The amount of tin compound in these electrolyte compositions is typically an amount that provides a tin content in the range of 5 to 150 g/L. Mixtures of tin compounds may be used.

The electrolyte useful in the present invention may be alkaline or acidic. Typically the electrolyte is acidic. Suitable acidic electrolytes include, but are not limited to: sulfuric acid, acetic acid, fluoroboric acid, alkanesulfonic acids such as methanesulfonic acid, ethanesulfonic acid, propanesulfonic acid and trifluoromethane sulfonic acid, arylsulfonic acids such as phenyl sulfonic acid, phenol sulfonic acid and toluene sulfonic acid, sulfamic acid, hydrochloric acid, and phosphoric acid. Mixtures of acids may be used in the present metal plating baths. Preferred acids include sulfuric acid, methanesulfonic acid, ethanesulfonic acid, propanesulfonic acid, and mixtures thereof. The acids may be present in an amount in the range of from 1 to 300 g/L. Electrolytes are generally commercially available from a variety of sources and may be used without further purification.

Such electrolytes may optionally contain a source of halide ions. Typically chloride ions are used. Exemplary chloride ion sources include copper chloride, tin chloride and hydrochloric acid. A wide range of halide ion concentrations may be used in the present invention. Typically, the halide ion concentration is in the range of 0 to 100 ppm based on the plating bath. Such halide ion sources are generally commercially available and may be used without further purification.

The plating compositions preferably contain an accelerator. Any accelerators (also referred to as brightening agents) are suitable for use in the present invention. Such accelerators are well-known to those skilled in the art. Accelerators include, but are not limited to: N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethylester; 3-mercapto-ethyl propylsulfonic acid-(3-sulfoethyl)ester; 3-mercapto-ethylsulfonic acid sodium salt; carbonic acid-dithio-o-ethylester-s-ester with 3-mercapto-1-ethane sulfonic acid potassium salt; bis-sulfoethyl disulfide; 3-(benzothiazolyl-s-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount of 0.1 ppm to 1000 ppm.

Any compound capable of suppressing the metal plating rate may be used as a suppressor in the electroplating compositions. Suitable suppressors include, but are not limited to: polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 100 to 100,000, preferably 500 to 10,000. When such suppressors are used, they are typically present in an amount in the range of from 1 to 10,000 ppm based on the weight of the composition, and more typically from 5 to 10,000 ppm.

In general, the reaction products of the compounds of formula (I) and one or more dihalogens have a number average molecular weight (Mn) of 500 to 50,000, typically from 1000 to 20,000, preferably from 2000 to 10,000, although reaction products having other Mn values may be used. Such reaction products may have a weight average molecular weight (Mw) value in the range of 1000 to 50,000, preferably from 5000 to 30,000, although other Mw values may be used.

The amount of the reaction product (leveling agent) used in the metal electroplating compositions depends upon the particular leveling agents selected, the concentration of the metal ions in the electroplating composition, the particular electrolyte used, the concentration of the electrolyte and the current density applied. In general, the total amount of the leveling agent in the electroplating composition is from 0.01 ppm to 5,000 ppm based on the total weight of the plating composition, although greater or lesser amounts may be used. Preferably, the total amount of the leveling agent is from 0.1 to 1000 ppm, more preferably from 0.1 to 500 ppm.

The electroplating compositions may be prepared by combining the components in any order. It is preferred that the inorganic components such as source of metal ions, water, electrolyte and optional halide ion source are first added to the bath vessel followed by the organic components such as leveling agent, accelerator, suppressor, and any other organic component.

The electroplating compositions may optionally contain a second leveling agent. Such second leveling agent may be a conventional leveling agent. Suitable conventional leveling agents that can be used in combination with the present leveling agents include, without limitations, those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. Such combination of leveling agents may be used to tailor the characteristics of the plating bath, including leveling ability and throwing power.

Typically, the plating compositions may be used at temperatures from 10° C. to 65° C. or higher. Preferably, the temperature of the plating composition is from 10° C. to 35° C. and more preferably from 15° C. to 30° C.

In general, the metal electroplating compositions are agitated during use. Any suitable agitation method may be used and such methods are well-known in the art. Suitable agitation methods include, but are not limited to: air sparging, work piece agitation, and impingement.

Typically, a substrate is electroplated by contacting the substrate with the plating composition. The substrate typically functions as the cathode. The plating composition contains an anode, which may be soluble or insoluble. Potential is typically applied to the cathode. Sufficient current density is applied and plating performed for a period of time sufficient to deposit a metal layer having a desired thickness on the substrate as well as fill blind vias and/or through-holes. Current densities, include, but are not limited to, the range of 0.05 A/dm$^2$ to 10 A/dm$^2$, although higher and lower current densities may be used. The specific current density depends in part upon the substrate to be plated and the leveling agent selected. Such current density choice is within the abilities of those skilled in the art.

An advantage of the present invention is that substantially level metal deposits are obtained on a PCB. By "substantially level" metal layer is meant that the step height, i.e., the difference between areas of dense very small apertures and areas free of or substantially free of apertures, is less than 5 μm, and preferably less than 1 μm. Through-holes and/or blind vias in the PCB are substantially filled. A further advantage of the present invention is that a wide range of apertures and aperture sizes may be filled.

Throwing power is defined as the ratio of the average thickness of the metal plated in the center of a through-hole compared to the average thickness of the metal plated at the surface of the PCB sample and is reported as a percentage. The higher the throwing power, the better the plating composition is able to fill the through-hole. Metal plating compositions of the present invention have a throwing power of ≥65%, preferably ≥70%. Metal plating compositions of the present invention also show improved thermal stability of a metal plated substrate as compared to many conventional metal plating compositions.

While the methods of the present invention have been generally described with reference to printed circuit board manufacture, it is appreciated that the present invention may be useful in any electrolytic process where an essentially level or planar metal deposit and filled apertures are desired. Such processes include semiconductor packaging and interconnect manufacture.

The following examples are intended to further illustrate the invention but are not intended to limit its scope.

EXAMPLE 1 (COMPARATIVE)

Imidazole (6.8 g, 100 mmol) and sodium hydride (2.64 g, 11 mmol) were dissolved in 50 mL of anhydrous tetrahydrofuran. The mixture was stirred and cooled in an ice bath for 2 hours until the formation of hydrogen gas ceased. 1,4-dibromobutane (10.8 g, 50 mmol) was added and the mixture was stirred at room temperature for 12 hours. After removing the precipitate, the solvent was removed to obtain 1,4-bis(N-imidazolyl)butane. Analysis of 1,4-bis(N-imidazolyl)butane by 1H NMR (Bruker, 400 MHz, $H_2O$-d2) showed the following peaks, confirming the structure: δ ppm: 8.81 (s, 2H, Haram); 7.51 (m, 4H, Haram.); 4.21 (m, 4H, 2×$CH_2$—N), 4.257 (m, 4H, 2×$CH_2$—NH) and 1.87-1.90 (m, 4H, 2×$CH_2$—$CH_2$—NH).

The 1,4-bis(N-imidazolyl)butane (2.18 g, 10 mmol) and 1,4-dibromobutane (2.16 g, 10 mmol) were dissolved in dimethyl formamide and the mixture was cooked at 100° C. for 24 hours. The resulting precipitate (product A) was collected by filtration and washed by ethyl acetate. The Mn was determined to be 4,224 and the Mw was determined to be 7,606.

EXAMPLE 2

Benzimidazole (11.8 g, 100 mmol) and sodium hydride (2.64 g, 11 mmol) were dissolved in 50 mL of anhydrous tetrahydrofuran. The mixture was stirred and cooled in an ice bath for 2 hours until the formation of hydrogen gas ceased. 1,4-dibromobutane (10.8 g, 50 mmol) was added and the mixture was stirred at room temperature for 12 hours. After removing the precipitate, the solvent was removed by evaporation to get 1, 4-bis(N-benzimidazolyl) butane. Analysis of 1,4-bis(N-imidazolyl) butane by 1H NMR (Bruker, 400 MHz, $H_2O$-d2) showed the following peaks, confirming the structure: δ ppm: 8.07 (s, 2H, Haram); 7.625 (m, 2H, Harom.); 7.447 (m, 2H, Harom), 7.238 (m, 4H, Harom) 4.89 (m, 4H, 2×$CH_2$—N), 4.25 (m, 4H, 2×$CH_2$—NH) and 1.87 (m, 4H, 2×$CH_2$—$CH_2$—NH).

1,4-bis(N-benzimidazolyl)butane (1.16 g, 4 mmol), 1,4-bis(N-imidazolyl)butane (1.14 g, 6 mmol) and 1,4-dibromobutane were dissolved in dimethyl formamide and the mixture was cooked at 100° C. for 24 hours. The resulting precipitate (product 1) was collected by filtration and washed by ethyl acetate. Molar ratio of benzimidazolium to imdazolium was 0.82 in the product 1 according to NMR result. Mn was determined to be 3,348 and the Mw was determined to be 18,602.

EXAMPLE 3

Benzimidazole (4.72 g, 4 mmol), imidazole (4.08 g, 6 mmol) and sodium hydride (2.64 g, 11 mmol) were dissolved in 50 mL of anhydrous tetrahydrofuran. The mixture was stirred and cooled in an ice bath for 2 hours until the formation of hydrogen gas ceased. 1,4-dibromobutane (10.8 g, 50 mmol) was added and the mixture was stirred at room temperature for 12 hours. After removing the precipitate by filtration, 50 ml of dimethyl formamide and 10.8 g of 1,4-dibromobutane (50 mmol) were added. The mixture was cooked at 100° C. for 24 hours. The resulting precipitate (product 2) was collected by filtration and washed by ethyl acetate. The molar ratio of benzimidazolium to imdazolium was 1.27 in the product according to NMR result. The Mn was determined to be 3,407 and the Mw was determined to be 12,581.

EXAMPLE 4

Six copper electroplating baths having the formula in Table 1 were prepared.

TABLE 1

| COMPONENT | Example 1 (comparative) | Example 1 (Comparative) | Example 2 | Example 2 | Example 3 | Example 3 |
|---|---|---|---|---|---|---|
| Copper sulfate pentahydrate | 73 g/L | 73 g/L | 73 g/L | 73 g/L | 73 g/L | 73 g/L |
| Sulfuric acid | 235 g/L | 235 g/L | 235 g/L | 235 g/L | 235 g/L | 235 g/L |
| Chloride from 1M hydrochloric acid | 60 ppm | 60 ppm | 60 ppm | 60 ppm | 60 ppm | 60 ppm |
| Leveler | 0.5 ppm | 0.1 ppm | 0.5 ppm | 0.1 ppm | 0.5 ppm | 0.1 ppm |
| bis-sulfopropyl disulfide | 3 ppm | 3 ppm | 3 ppm | 3 ppm | 3 ppm | 3 ppm |
| polypropylene glycol copolymer | 15 mL/L | 15 mL/L | 15 mL/L | 15 mL/L | 15 mL/L | 15 mL/L |

The copper electroplating baths were placed in a Haring Cell and a copper clad FR4/glass epoxy panel 3.2 mm thick with a plurality of through-holes having an average diameter of 300 μm was placed in each Haring Cell according to the sequence disclosed in Table 2 below.

TABLE 2

| # | Sequence | Condition | |
|---|---|---|---|
| 1 | 1480 mL was added to the cleaned Haring Cells | 25° C. | |
| 2 | Carrier was added to the copper plating bath | 15 | mL/L |
| 3 | Leveler was added to the copper plating bath in amounts shown in Table 1 | | |
| 4 | Copper anodes were clipped into the slots of the Haring Cell | | |
| 5 | Air agitation | 2.5 | Lpm |
| 6 | bis-sulfopropyl disulfide brightener was added to the copper plating bath | 3 | ppm |
| 7 | The cleaned copper panels were connected to the Haring Cell | | |
| 8 | The electrodes were connected to the power supply | | |
| 9 | Plated for 80 minutes | 2.2 | ASD |
| 10 | Power Supply was then disconnect to the cell and electrodes | | |
| 11 | The plated panels were removed from the Haring Cells | | |
| 12 | Each panel was rinses in DI water | 1 | minute |
| 13 | Each panel was soaked in ANTI-TARNISH™ 7130 solution (available from the Dow Chemical Company, Midland, MI) | 1 | minute |
| 14 | Each panel was rinsed in DI water | 1 | minute |
| 15 | The panels were dried with compressed air | | |
| 16 | The panels were then examined (see below) | | |

The area of each panel with the though-holes was cut, mounted and cross-sectioned. The thickness of the copper deposit was measured on the surface of each panel as well as the average thickness in the through-holes using optical microscopy. Measured thicknesses were adjusted for through-hole location diameter after cross-sectioning. Throwing power was calculated by determining the ratio of the average thickness of the metal plated in the center of the through-hole compared to the average thickness of the metal plated at the surface of the panel. The average throwing power (TP) of the panels is recorded in Table 3.

The percent cracking was determined according to the industry standard procedure IPC-TM-650-2.68 Thermal Stress, Plated-through Holes, published by IPC (Northbrook, Ill., U.S.A.), May 2004, revision E.

TABLE 3

| Reaction product | Leveler (ppm) | Brightener (ppm) | TP % | Cracking ratio |
|---|---|---|---|---|
| Example 1 | 0.5 | 3 | 61.9 | 0 |
| Example 1 | 0.1 | 3 | 58.9 | 0 |
| Example 2 | 0.5 | 3 | 71.1 | 0 |
| Example 2 | 0.1 | 3 | 67.7 | 0 |
| Example 3 | 0.5 | 3 | 75.9 | 0 |
| Example 3 | 0.1 | 3 | 88 | 0 |

Although the panels plated with the copper electroplating baths which included the leveler which only contained the imidazole moiety showed no cracking, the copper electroplating baths which included the levelers with the benzimidazole moieties had higher throwing powers. The leveler of Example 1 only had TP % values of 58.9% and 61.9%. In contrast, the levelers of Example 2 and 3 had TP % values of 67.7%, 71.1%, 75.9% and 88%. Accordingly, the levelers with the benzimidazole moieties had improved throwing power.

What is claimed is:

1. A copper electroplating composition comprises: one or more sources of copper ions, an acid electrolyte, wherein the acid electrolyte comprises one or more acids and, optionally, one or more sources of halide ions, and one or more polymers, the polymers comprise a reaction product of one or more dihalogens having a formula:

$$X-R-X \qquad (X)$$

and one or more compounds having formula:

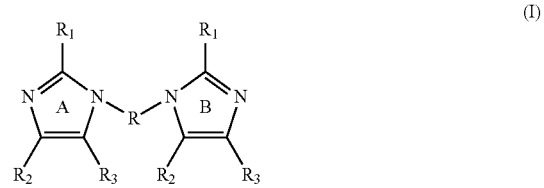

(I)

where $R_1$, $R_2$ and $R_3$ of rings A and B may be the same or different and are hydrogen, thiol, linear or branched thio($C_1$-$C_{12}$)alkyl, hydroxyl, linear or branched hydroxy($C_1$-$C_{12}$)alkyl, amine, linear or branched alkyl ($C_1$-$C_{12}$)amine, linear or branched ($C_1$-$C_{12}$)alkyl, alkoxy, linear or branched alkoxy($C_1$-$C_{12}$)alkyl or substituted or unsubstituted aryl, with the proviso that at least one of the compounds of formula (I) reacts with the one or more dihalogens to form the reaction product, $R_2$ and $R_3$ of ring A or B are taken together with their carbon atoms to form a fused substituted or unsubstituted six membered aromatic ring; and R is ($C_1$-$C_{12}$)alkyl, and X is a halide selected from the group consisting of fluoride, chloride, bromide and iodide.

2. The copper electroplating composition of claim 1, wherein the one or more polymers are included in the composition in amounts from 0.01 ppm to 5,000 ppm.

3. The copper electroplating composition of claim 1, further comprising one or more accelerators and suppressors.

* * * * *